US012609170B2

(12) United States Patent
Zhou et al.

(10) Patent No.: US 12,609,170 B2
(45) Date of Patent: Apr. 21, 2026

(54) MANAGING PROGRAM OPERATIONS IN MEMORY SYSTEMS

(71) Applicant: Yangtze Memory Technologies Co., Ltd., Hubei (CN)

(72) Inventors: Xufeng Zhou, Wuhan (CN); Zhipeng Dong, Wuhan (CN); Jinchi Han, Wuhan (CN); Wei Huang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 130 days.

(21) Appl. No.: 18/751,099

(22) Filed: Jun. 21, 2024

(65) Prior Publication Data

US 2025/0336451 A1      Oct. 30, 2025

(30) Foreign Application Priority Data

Apr. 29, 2024    (CN) .......................... 202410545481.8

(51) Int. Cl.
*G11C 16/34*        (2006.01)
*G11C 16/10*        (2006.01)
(52) U.S. Cl.
CPC ........ *G11C 16/3418* (2013.01); *G11C 16/102* (2013.01); *G11C 16/3459* (2013.01)

(58) Field of Classification Search
CPC .. G11C 16/3418; G11C 16/102; G11C 6/3459
See application file for complete search history.

(56) References Cited

U.S. PATENT DOCUMENTS

2021/0158866 A1*    5/2021   Sethuraman ...... G11C 11/40626
2025/0246254 A1*    7/2025   Quinsat .................. H10B 61/22

* cited by examiner

*Primary Examiner* — Han Yang
(74) *Attorney, Agent, or Firm* — Fish & Richardson P.C.

(57) ABSTRACT

Methods, systems, and apparatus for management of program operations in a memory system are described. An example system includes a memory device and a memory controller. The memory device includes a memory cell array and a peripheral circuit coupled to the memory cell array. The peripheral circuit obtains a first temperature, and in response to determining that the first temperature is at or above a predetermined threshold, apply a first program voltage pulse with a first pulse width to a specified word line coupling memory cells of the memory cell array. The peripheral circuit obtains obtain a second temperature, and in response to determining that the second temperature is below the predetermined threshold, apply a second program voltage pulse with a second pulse width to the specified word line, where the second pulse width is larger than the first pulse width.

20 Claims, 15 Drawing Sheets

800

802 — OBTAINING A FIRST TEMPERATURE

804 — IN RESPONSE TO DETERMINING THAT THE FIRST TEMPERATURE IS AT OR ABOVE A PREDETERMINED THRESHOLD, APPLYING A FIRST PROGRAM VOLTAGE PULSE WITH A FIRST PULSE WIDTH TO A SPECIFIED WORD LINE

806 — OBTAINING A SECOND TEMPERATURE

808 — IN RESPONSE TO DETERMINING THAT THE SECOND TEMPERATURE IS BELOW THE PREDETERMINED THRESHOLD, APPLYING A SECOND PROGRAM VOLTAGE PULSE WITH A SECOND PULSE WIDTH TO THE SPECIFIED WORD LINE, WHERE THE SECOND PULSE WIDTH IS LARGER THAN THE FIRST PULSE WIDTH

202

104

MEMORY
DEVICE

CONTROLLER

106

204

206

104

| MEMORY DEVICE | MEMORY DEVICE | MEMORY DEVICE |
| MEMORY DEVICE | MEMORY DEVICE | MEMORY DEVICE |

CONTROLLER

106

208

702

702

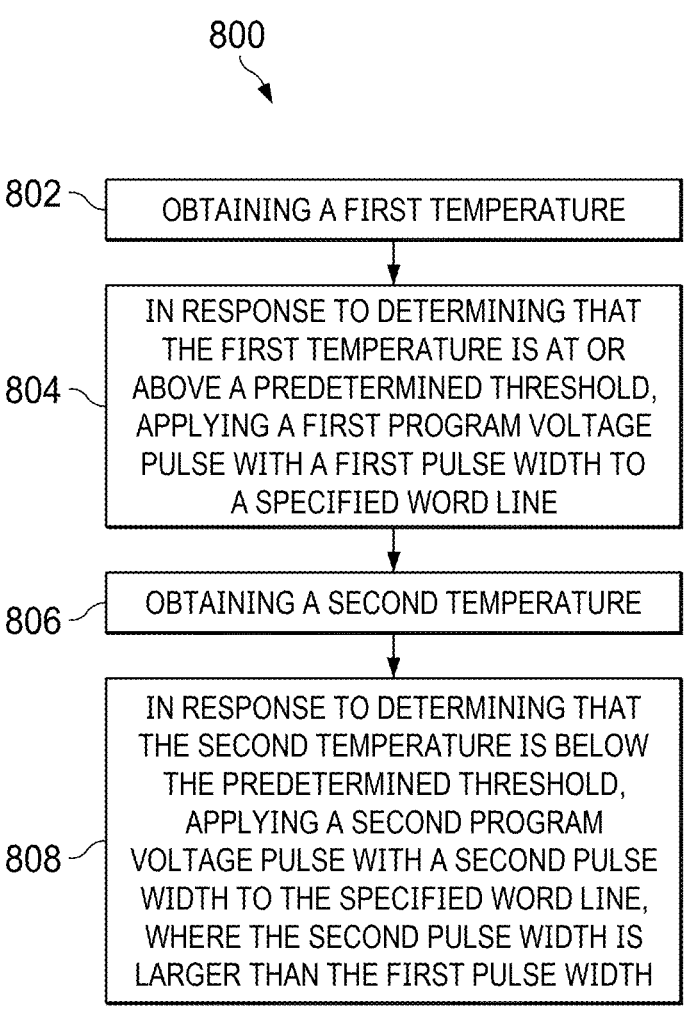

800

802 — OBTAINING A FIRST TEMPERATURE

804 — IN RESPONSE TO DETERMINING THAT THE FIRST TEMPERATURE IS AT OR ABOVE A PREDETERMINED THRESHOLD, APPLYING A FIRST PROGRAM VOLTAGE PULSE WITH A FIRST PULSE WIDTH TO A SPECIFIED WORD LINE

806 — OBTAINING A SECOND TEMPERATURE

808 — IN RESPONSE TO DETERMINING THAT THE SECOND TEMPERATURE IS BELOW THE PREDETERMINED THRESHOLD, APPLYING A SECOND PROGRAM VOLTAGE PULSE WITH A SECOND PULSE WIDTH TO THE SPECIFIED WORD LINE, WHERE THE SECOND PULSE WIDTH IS LARGER THAN THE FIRST PULSE WIDTH

FIG. 8

| PULSE | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|
| P1 | > | > | > | > | > | > | > | > | | | | | | | | | | | | | | | |
| P2 | | | | | | | > | > | > | > | > | | | | | | | | | | | | |
| P3 | | | | | | | | | > | > | > | > | > | | | | | | | | | | |
| P4 | | | | | | | | | | | > | > | > | > | > | | | | | | | | |
| P5 | | | | | | | | | | | | | > | > | > | > | > | > | | | | | |
| P6 | | | | | | | | | | | | | | | | > | > | > | > | > | | | |
| P7 | | | | | | | | | | | | | | | | | | | > | > | > | > | |

FIG. 9

MANAGING PROGRAM OPERATIONS IN MEMORY SYSTEMS

CROSS-REFERENCE TO RELATED APPLICATIONS

This application claims priority to Chinese Patent Application No. 202410545481.8, filed on Apr. 29, 2024, which is hereby incorporated by reference in its entirety.

TECHNICAL FIELD

The present disclosure generally relates to memory systems, and more specifically, to management of program operations of memory systems.

BACKGROUND

Program voltage in semiconductor manufacturing typically refers to the voltage used to change the state of a memory cell in non-volatile memory technologies, like Flash memory. The program voltage can depend on the specific technology, process, and the design of the semiconductor device being manufactured.

SUMMARY

The present disclosure describes management of program operations in memory systems.

In one aspect, the present disclosure describes a memory device. The memory device includes a memory cell array and a peripheral circuit coupled to the memory cell array. The peripheral circuit is configured to: obtain a first temperature; in response to determining that the first temperature is at or above a predetermined threshold, apply a first program voltage pulse with a first pulse width to a specified word line coupling memory cells of the memory cell array; obtain a second temperature; and in response to determining that the second temperature is below the predetermined threshold, apply a second program voltage pulse with a second pulse width to the specified word line, wherein the second pulse width is larger than the first pulse width.

In another aspect, the present disclosure describes a method performed by a peripheral circuit in a memory device. The method includes: obtaining, by the peripheral circuit, a first temperature; in response to determining that the first temperature is at or above a predetermined threshold, applying, by the peripheral circuit, a first program voltage pulse with a first pulse width to a specified word line coupling memory cells of the memory cell array; obtaining, by the peripheral circuit, a second temperature; and in response to determining that the second temperature is below the predetermined threshold, applying, by the peripheral circuit, a second program voltage pulse with a second pulse width to the specified word line, wherein the second pulse width is larger than the first pulse width.

In still another aspect, the present disclosure describes a system that includes a memory device and a controller coupled to the memory device. The memory device includes a memory cell array and a peripheral circuit coupled to the memory cell array. The peripheral circuit is configured to: obtain a first temperature; in response to determining that the first temperature is at or above a predetermined threshold, apply a first program voltage pulse with a first pulse width to a specified word line coupling memory cells of the memory cell array; obtain a second temperature; and in response to determining that the second temperature is below the predetermined threshold, apply a second program voltage pulse with a second pulse width to the specified word line, wherein the second pulse width is larger than the first pulse width.

The details of one or more implementations of the subject matter of this disclosure are set forth in the accompanying drawings and the description below. Other features, aspects, and advantages of the subject matter will become apparent from the description, the drawings, and the claims.

BRIEF DESCRIPTION OF THE DRAWINGS

FIG. 8 illustrates a flow chart of an example process of managing program operations in a memory device, in accordance with one or more implementations of the present disclosure.

FIG. 9 illustrates example program verification when programing memory cells to different programmed states, in accordance with one or more implementations of the present disclosure.

Like reference numbers and designations in the various drawings indicate like elements.

DETAILED DESCRIPTION

The disclosed subject matter can help address technical challenges associated with the miniaturization of complementary metal-oxide-semiconductor (CMOS) memory devices, particularly the diminution of string driver capabilities due to reduced die sizes. As CMOS die size decreases, string driver size is also required to shrink, thereby weakening string driver capability. Low string driver capability may not provide sufficient high program voltage, potentially resulting in program failure and programming inefficacies. To counteract this, it is proposed to reduce the program voltage, such as the maximum final program voltage in an Incremental Step Pulse Programming (ISPP) loop, thereby enhancing the device reliability and facilitating die size reduction. In some instances, the required or desired maximum program voltage at lower temperatures (e.g., –25 degrees Celsius) is higher than the one in higher temperatures (e.g., 85 degrees Celsius). In some instances, the maximum program voltage for memory cells situated in upper layers of a memory cell array is also higher than the one for memory cells situated in lower layers, due to the comparatively larger critical dimensions (CDs).

In view of these challenges, the present disclosure introduces techniques for adaptively changing a duration of a program voltage pulse applied to word lines coupling memory cells under conditions of low temperature. For example, the duration of program pulse applied to a word line can be increased as word line CD increases. By prolonging or the pulse duration or increasing pulse width for the selected word lines, it can help memory cells acquire the necessary energy for consistent programming at reduced voltage levels, thus compensating for the diminished capacitive driving capacity inherent in scaled-down string drivers.

Furthermore, the present disclosure describes preventative techniques against potential over-programming issues. Example techniques include using a lower initial program voltage at low temperatures to avert the imposition of surplus charge upon the cells. Moreover, the present disclosure sets forth a precocious execution of program verification steps when programming memory cells to a target programmed state at low temperatures (e.g., less than –25 degrees Celsius or from –25 to 0 degrees Celsius). By starting verification earlier, over-programming can be detected earlier, thereby preventing the excessive charge build-up within the memory cells, which could otherwise impair functionality and longevity of the memory device. By curtailing instances of over-programming, it can effectively minimize memory cell wear, thus prolonging the operational lifespan of the memory device.

Figure 1:
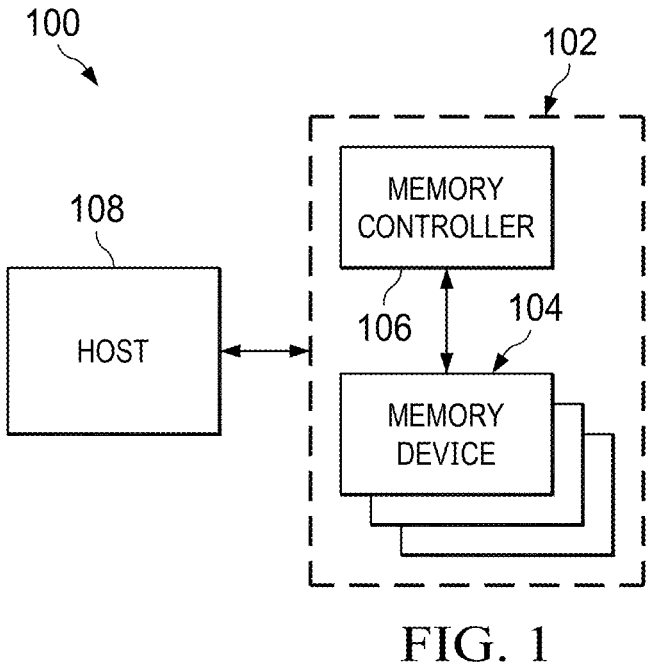
FIG. 1 illustrates a block diagram of an example system, in accordance with one or more implementations of the present disclosure.

FIG. 1 shows a block diagram of an example system 100, in accordance with some aspects of the present disclosure. System 100 can be a mobile phone, desktop computer, laptop computer, tablet computer, vehicle computer, game console, printer, positioning device, wearable electronic device, smart sensor, Virtual Reality (VR) device, Augmented Reality (AR) device, or any other suitable electronic device having storage therein. As shown in FIG. 1, system 100 can include a host 108 and a memory system 102. Memory system 102 includes one or more memory devices 104 and a memory controller 106. Host 108 can be, for example, a processor (e.g., a Central Processing Unit (CPU)) or a system on a chip (SoC) (e.g., an Application Processor (AP)) of an electronic device. Host 108 can be configured to send data to memory device 104 or receive data from memory device 104. To send data to memory device 104 or receive data from memory device 104, host 108 can send instructions to memory system 102 in addition to the data.

Memory device 104 can be any memory device disclosed in the present disclosure. In some implementations, memory device 104, such as a NAND Flash memory device, can perform a program operation on one or more memory cells such as xLCs (i.e., memory cells configured to store a piece of N-bits data at one of $2^N$ levels, where N is an integer greater than 1) based on a data page having N bits of data for each xLC. In some examples, the xLC may store two bits per cell (MLC), three bits per cell (TLC), or four bits per cell (QLC), etc.

In some implementations, memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, enterprise storage arrays, and the like.

Memory controller 106 can be configured to control the operation (e.g., read, erase, and program (or write) operations) of memory device 104. For example, based on instructions received from host 108, memory controller 106 can transmit various commands (e.g., program (or write) commands, read commands, erase commands, etc.) to memory device 104 to control the operation of memory device 104. In some implementations, memory controller 106 transmits a program command to memory device 104 to initiate a program operation to be performed by memory device 104. During an ongoing program operation, an interrupt (e.g., a read operation to another page) may occur, for example, from host 108. Memory controller 106 may be configured to transmit an interrupt command to memory device 104 to suspend the program operation. In some implementations, upon completion of other operations triggered by the interrupt, memory controller 106 also can be configured to transmit a resume command to memory device 104 to resume and complete the suspended program operation.

Memory controller 106 can also be configured to manage various functions with respect to data stored or to be stored in memory devices 104, including but not limited to bad block management, garbage collection, logical to physical address translation, wear leveling, and the like. In some implementations, memory controller 106 is also configured to process Error Correction Codes (ECC) with respect to data read from memory device 104 or written to the memory device 104. Memory controller 106 can also perform any other suitable functions, such as formatting memory device 104. The memory controller 106 can communicate with external devices (e.g., host 108) according to a particular communication protocol. For example, the memory control-ler 106 can communicate with the external device via at least one of various interface protocols, such as a USB protocol, an MMC protocol, a Peripheral Component Interconnect (PCI) protocol, a PCI express (PCI-E) protocol, an Advanced Technology Attachment (ATA) protocol, a serial ATA protocol, a parallel ATA protocol, a small computer system small interface (SCSI) protocol, an Enhanced Small Disk Interface (ESDI) protocol, an Integrated Drive Elec-tronics (IDE) protocol, a Firewire protocol, and so forth.

Memory controller 106 and the one or more memory devices 104 can be integrated into various types of storage devices and can be included, for example, in the same package (e.g., a Universal Flash Storage (UFS) package or an eMMC package). That is, memory system 102 can be implemented and packaged into different types of end elec-tronic products.

Figure 2A:
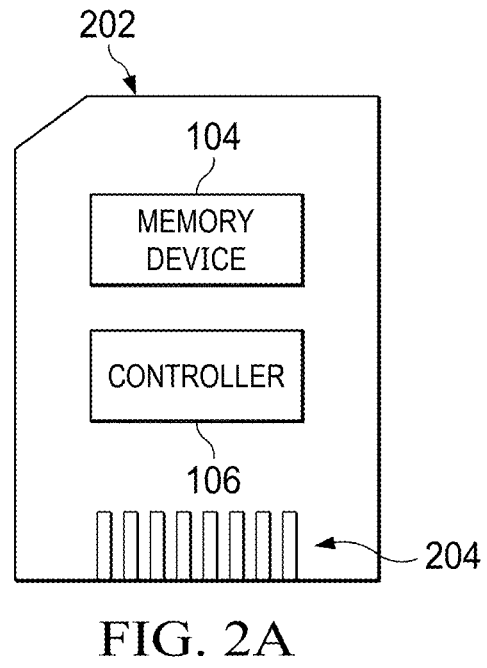
FIG. 2A illustrates a diagram of an example memory card, in accordance with one or more implementations of the present disclosure.

In one example as shown in FIG. 2A, memory controller 106 and the single memory device 104 can be integrated into a memory card 202. Memory card 202 can include a PC card (PCMCIA), a CF card, a Smart Media (SM) card, a memory stick, a multimedia card (MMC, RS-MMC, MMCmicro), an SD card (SD, miniSD, microSD, SDHC), a UFS, and the like. Memory card 202 can also include a memory card connector 204 configured to couple memory card 202 to a host (e.g., host 108 in FIG. 1).

Figure 2B:
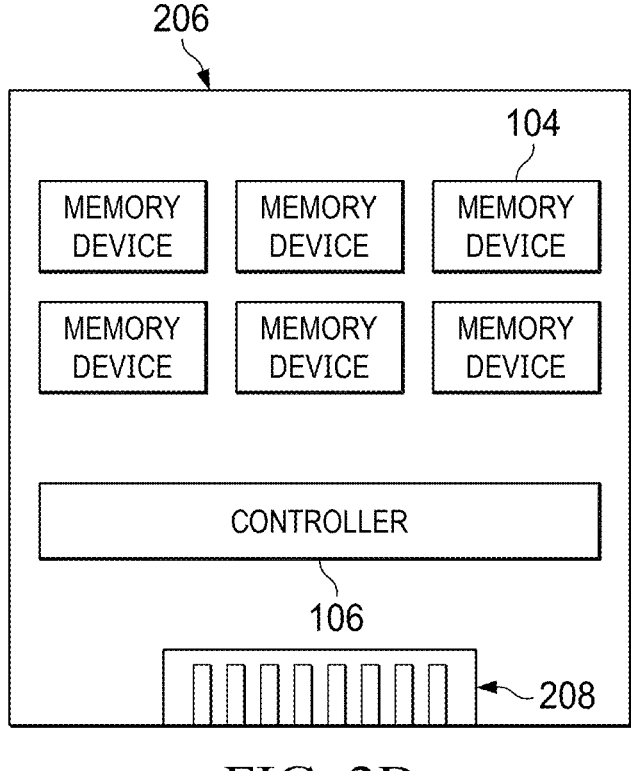
FIG. 2B illustrates a diagram of an example solid-state drive (SSD), in accordance with one or more implementations of the present disclosure.

In another example as shown in FIG. 2B, memory con-troller 106 and multiple memory devices 104 can be inte-grated into the SSD 206. SSD 206 can also include an SSD connector 208 configured to couple SSD 206 to a host (e.g., host 108 in FIG. 1). In some implementations, the storage capacity and/or operating speed of SSD 206 is greater than the respective storage capacity and/or operating speed of memory card 202.

Figure 3:
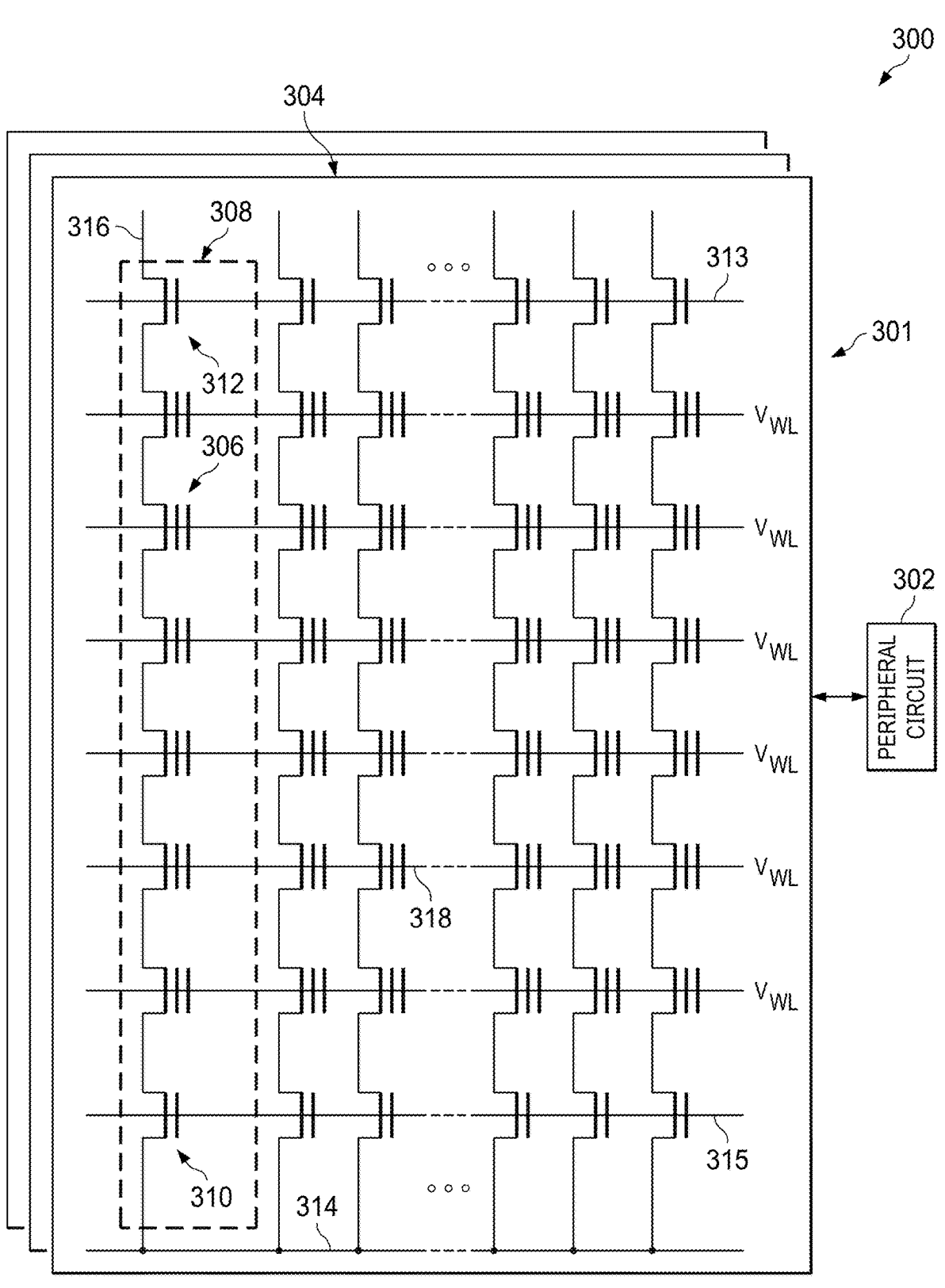
FIG. 3 illustrates a schematic circuit diagram of an example memory device, in accordance with one or more implementations of the present disclosure.

FIG. 3 shows a schematic circuit diagram of a memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some imple-mentations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single level cell (SLC) that has two possible memory states (levels) and thus, can store one bit of data. For example, the first memory state "0" can correspond to a first range of threshold voltages, and the second memory state "1" can correspond to a second range of threshold voltages. In some implementations, each memory cell 306 is an xLC that is capable of storing more than a single bit of data in more than four memory states (levels). For example, the xLC may store two bits per cell (MLC), three bits per cell (TLC), or four bits per cell (QLC)). Each xLC can be programmed to assume a range of possible nominal storage values (i.e., $2^N$ pieces of N-bits data, e.g., gray codes). In one example, the MLC can be programmed to assume one of three possible programming levels by writing one of three possible nomi-nal storage values to the cell. A fourth nominal storage value can be used for the erased state.

As shown in FIG. 3, each NAND memory string 308 can also include a source select gate (SSG) transistor 310 at its source end and a drain select gate (DSG) transistor 312 at its drain end. SSG transistor 310 and DSG transistor 312 can be configured to activate select NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ACS), according to some implementations. The drain of each NAND memory string 308 is coupled to a respective bit line 316 from which data can be read or written via an output bus (not shown), according to some implementations. In some implementa-tions, each NAND memory string 308 is configured to be selected or deselected by applying a select voltage or a deselect voltage to the gate of respective DSG transistor 312 through one or more DSG lines 313 and/or by applying a select voltage or a deselect voltage to the gate of respective SSG transistor 310 through one or more SSG lines 315.

As shown in FIG. 3, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a select block 304, source lines 314 coupled to select block 304 as well as unselect blocks 304 in the same plane as select block 304 can be biased with an erase voltage (Vers), such as a high positive bias voltage (e.g., 20 V or more). Memory cells 306 of adjacent NAND memory strings 308 can be coupled through word lines 318 that select which row of memory cells 306 is affected by read and program operations.

As shown in FIG. 3, memory cell array 301 can include an array of memory cells 306 in a plurality of rows and a plurality of columns in each block 304. One row of memory cells 306 corresponds to one or more pages, and one column of memory cells corresponds to one NAND memory string 308, according to some implementations. The plurality of rows of memory cells 306 can be respectively coupled to word lines 318, and the plurality of columns of memory cells 306 can be respectively coupled to bit lines 316. Peripheral circuit 302 can be coupled to memory cell array 301 through bit lines 316 and word lines 318.

Figure 4:
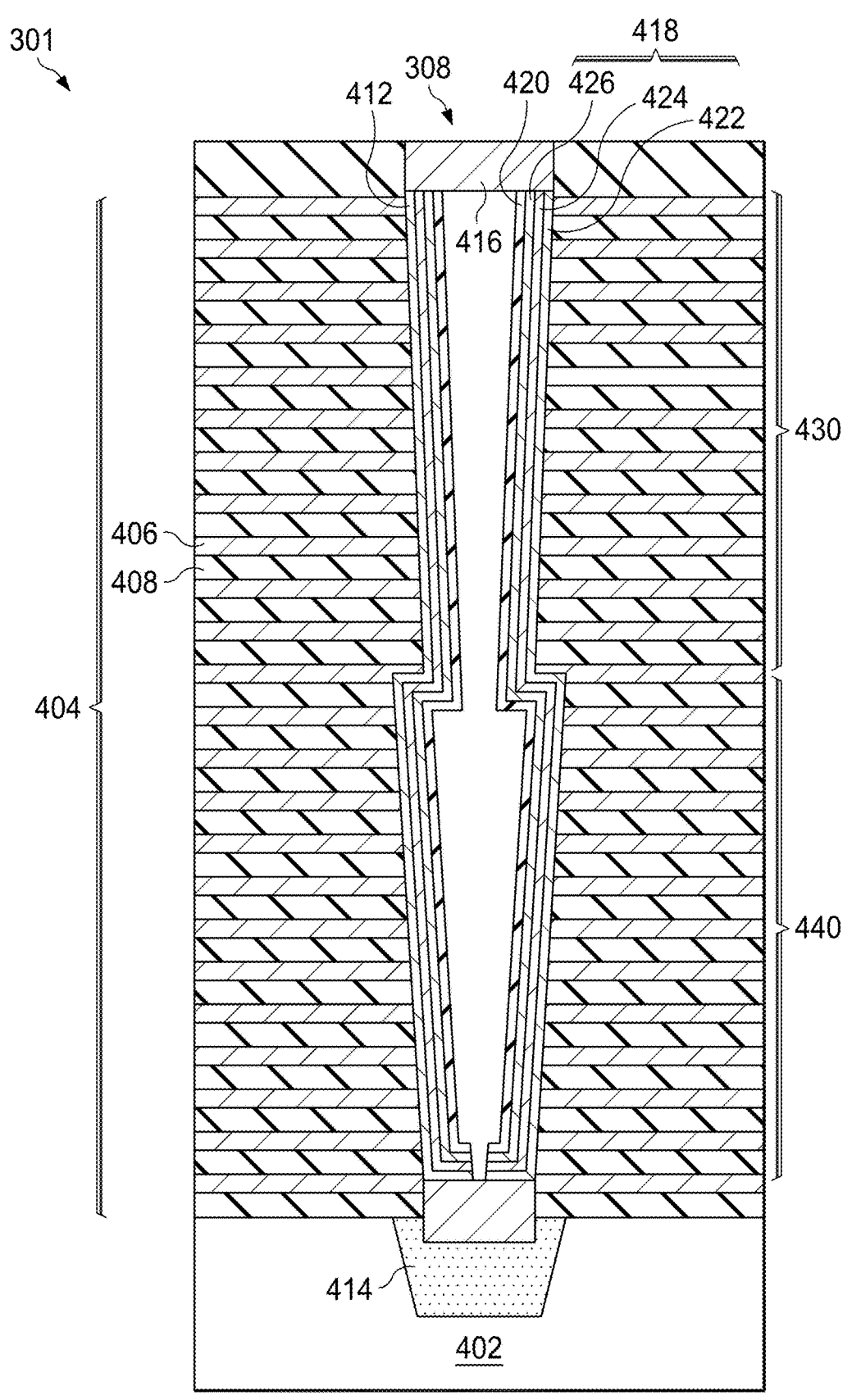
FIG. 4 illustrates a side view of a cross-section of an example memory cell array, in accordance with one or more implementations of the present disclosure.

FIG. 4 illustrates a side view of a cross-section of memory cell array 301 including NAND memory string 308, accord-ing to some aspects of the present disclosure. As shown in FIG. 4, NAND memory string 308 can extend vertically through a memory stack 404 above a substrate 402. Sub-strate 402 can include silicon (e.g., single crystalline sili-con), silicon germanium (SiGe), gallium arsenide (GaAs), germanium (Ge), silicon on insulator (SOI), germanium on insulator (GOI), or any other suitable materials.

Memory stack 404 can include interleaved gate conduc-tive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include control gates surrounding memory cells 306, the gates of DSG transistors 312, or the gates of SSG transistors 310, and can extend laterally as DSG line 313 at the top of memory stack 404, SSG line 315 at the bottom of memory stack 404, or word line 318 between DSG line 313 and SSG line 315.

As shown in FIG. 4, NAND memory string 308 includes a channel structure 412 extending vertically through memory stack 404. In some implementations, channel structure 412 includes a channel hole filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap/storage layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4, a well 414 (e.g., a P-well and/or an N-well) is formed in substrate 402, and the source end of NAND memory string 308 is in contact with well 414, according to some implementations. For example, source line 314 may be coupled to well 414 to apply an erase voltage to well 414, i.e., the source of NAND memory string 308, during erase operations. In some implementations, NAND memory string 308 further includes a channel plug 416 at the drain end of NAND memory string 308. It is understood that although not shown in FIG. 4, additional components of memory cell array 301 can be formed including, but not limited to, gate line slits/source contacts, local contacts, interconnect layers, etc.

As shown in FIG. 4, memory stack 404 includes two sections or groups of cells within the stack, namely, upper deck 440 and lower deck 440. In the context of 3D memory devices, memory cells are stacked vertically in multiple layers to increase storage density. A "deck" in this context is a subset of these layers. For example, if a memory string has 64 layers, it might be divided into an upper and a lower deck, each comprising 32 layers. The division into decks is not just physical but also functional. Each deck can be independently accessed and operated, which can improve performance, reduce power consumption, and increase the efficiency of memory operations. In the shown example, lower deck 440 refers to the layers closer to the substrate 402, and upper deck 430 refers to the layers further away from the substrate 402. By organizing the memory cells into decks, it can reduce interference between cells, which can improve data integrity and read/write speeds. Different decks can be used to implement wear-leveling strategies, distributing write and erase cycles across the memory chip to prolong its lifespan. This architecture also allows for scalability in memory design. For example, manufacturers can increase storage capacity by adding more layers (i.e., decks) without significantly increasing the chip's footprint.

In some cases, variations in the size of the channel structure along the vertical direction, e.g., the stacking direction of the memory cells, in the decks of a memory string in 3D memory devices can occur due to several factors inherent in the manufacturing process. For example, the variations in the size of the channel structure can occur due to one or more of the following factors: deposition inconsistencies, etching variabilities, lithography challenges, stress and strain during fabrication, chemical mechanical polishing (CMP) irregularities, thermal effects, diffusion and material interactions, or limitations of current technology.

In the shown example, channel structure 412 within each deck of upper deck 430 and lower deck 440 exhibits a dimensional decrement proceeding from the topmost layer towards the bottommost layer. This gradation is manifested as a progressive reduction in the cross-sectional area of channel structure 412, whereby the uppermost layer of each deck possesses the largest channel size, and this channel size diminishes in each subsequent layer down to the lowermost layer of the deck.

Note that memory string 308 in FIG. 4 is shown to include two decks for illustrative purposes. In some examples, memory string 308 can have any suitable number of decks, where each deck can have any suitable number of layers, such as 4 decks each consisting of 8 layers, 8 decks each consisting of 8 layers or 12 layers, 16 decks each consisting of 8 layers, or 22 decks each consisting of 8 layers.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each select memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies.

Figure 5:
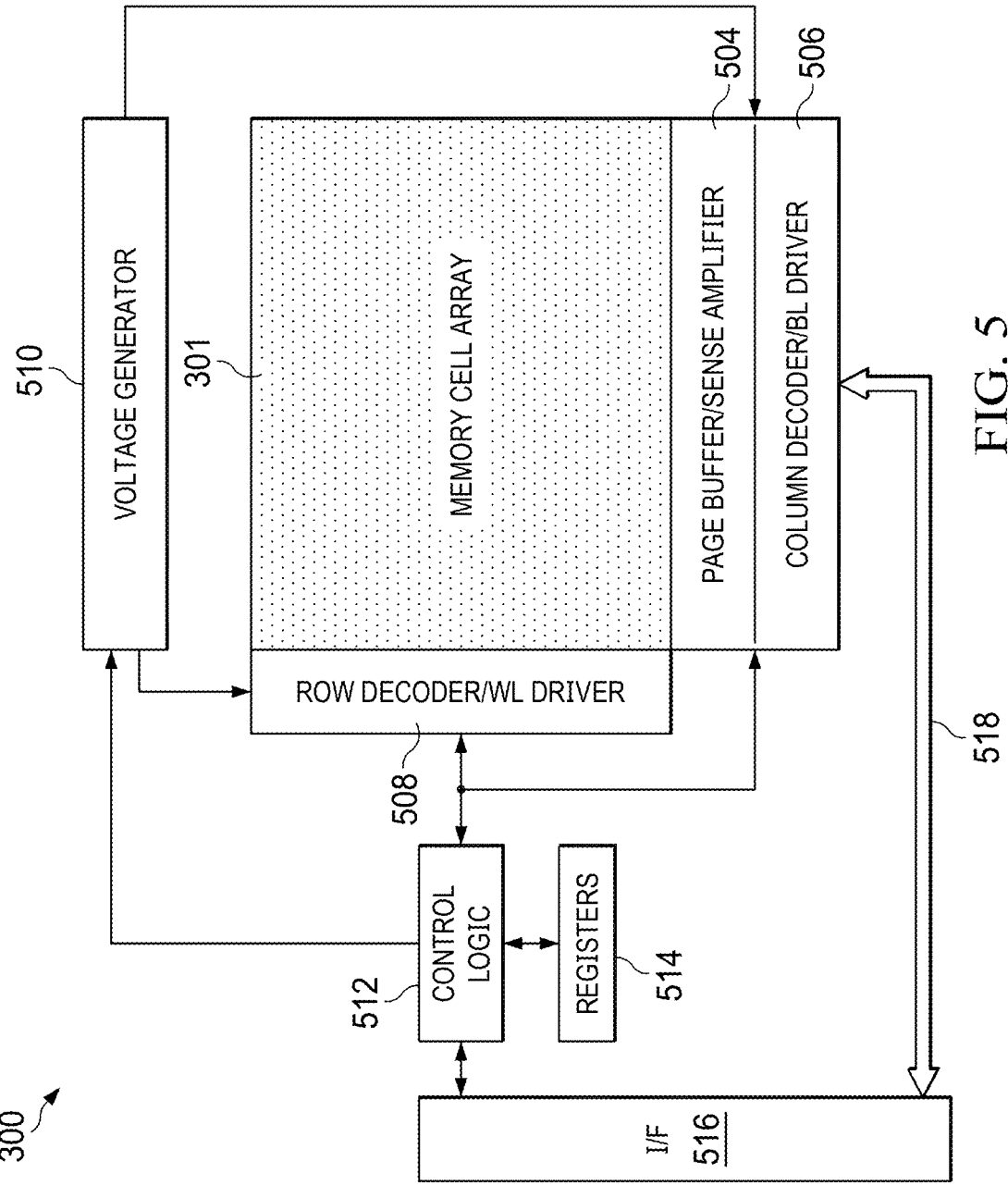
FIG. 5 illustrates a block diagram of an example memory device, in accordance with one or more implementations of the present disclosure.

FIG. 5 illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that, in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store data to be programmed into one page of memory cell array 301. In another example, page buffer/sense amplifier 504 may verify programmed select memory cells 306 in each program/verify loop (cycle) in a program operation to ensure that the data has been properly programmed into memory cells 306 coupled to select word lines 318. In still another example, page buffer/sense amplifier 504 may also sense the low power signals from bit line 316 that represents a data bit stored in memory cell 306 and amplify the small voltage swing to recognizable logic levels in a read operation. As described below in detail and consistent with the scope of the present disclosure, in program operations, page buffer/ sense amplifier 504 can include a plurality of page buffer circuits respectively coupled to bit lines 316, and each including a set of storage units (e.g., latches) for temporarily storing a piece of N-bits data (e.g., in the form of gray codes) received from data bus 518 and providing the piece of N-bits data to a corresponding select memory cell 306 through the corresponding bit line 316 in a program operation using a multi-cache loading scheme.

Column decoder/bit line driver 506 can be configured to be controlled by control logic 512 and select one or more NAND memory strings 308 by applying bit line voltages generated from voltage generator 510. Row decoder/word line driver 508 can be configured to be controlled by control logic 512 and select/deselect blocks 304 of memory cell array 301 and select/deselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315 and DSG lines 313 as well. Voltage generator 510 can be configured to be controlled by control logic 512 and generate the word line voltages (e.g., read voltage, program voltage, channel pass voltage, local voltage, verify voltage, etc.), bit line voltages, and source line voltages to be supplied to memory cell array 301.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit. Interface 516 can be coupled to control logic 512 and act as a control buffer to buffer and relay control commands received from a memory controller (e.g., 106 in FIG. 1) and/or a host (e.g., 108 in FIG. 1) to control logic 512 and status information received from control logic 512 to the memory controller and/or the host. Interface 516 can also be coupled to column decoder/bit line driver 506 via data bus 518 and act as a data input/output (I/O) interface and a data buffer to buffer and relay the data to and from memory cell array 301.

Figure 6:
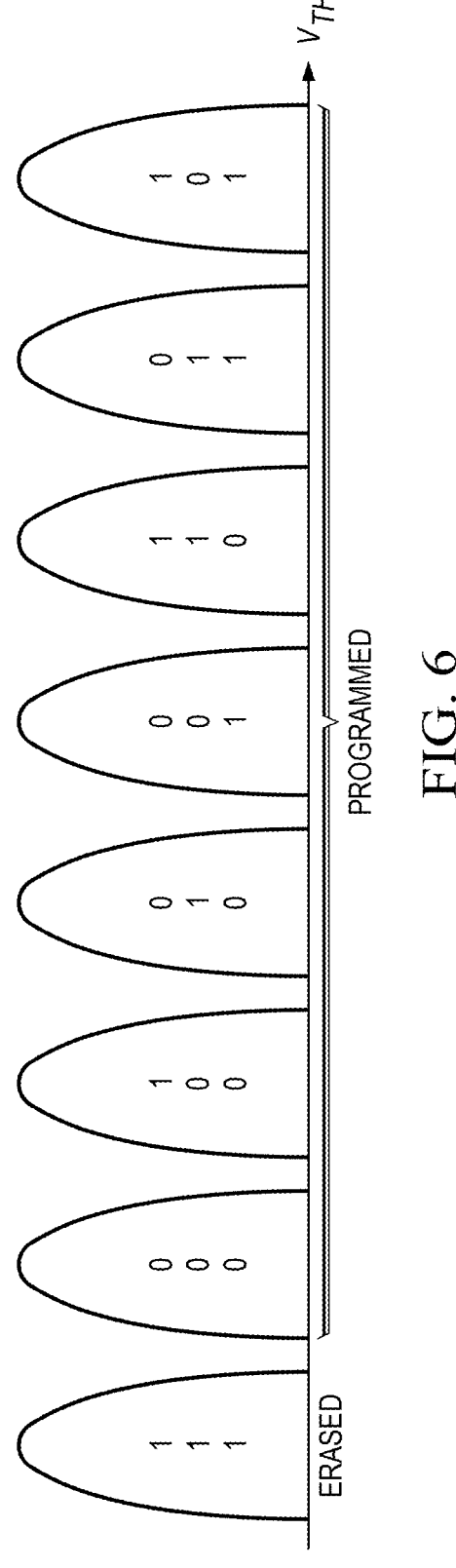
FIG. 6 illustrates threshold voltage distributions of memory cells in an example program operation, in accordance with one or more implementations of the present disclosure.

FIG. 6 illustrates exemplary threshold voltage distributions of memory cells in a program operation, according to some aspects of the present disclosure. As described above, each memory cell 306 can be configured to store a piece of N-bits data in one of $2^N$ levels, where N is an integer greater than 1 (e.g., N=2 for MLCs, N=3 for TLCs, N=4 for QLCs, etc.). Each level can correspond to one of $2^N$ threshold voltage ($V_{TH}$) ranges of memory cells 306. Taking TLCs, where N=3, for example, as shown in FIG. 6, memory cell 306 may be programmed into one of the 8 levels, including one level of the erased state and 7 levels of the programmed states. Each level may correspond to a respective threshold voltage ($V_{TH}$) range of memory cells 306. For example, the level corresponding to the lowest threshold voltage range (the left-most threshold voltage distribution in FIG. 6) may be considered as level 0, the level corresponding to the second-lowest threshold voltage range (the second left-most threshold voltage distribution in FIG. 6) may be considered as level 1, and so until level 7 corresponding to the highest threshold voltage range (the right-most threshold voltage distribution in FIG. 6).

Each level can correspond to one of the $2^N$ pieces of N-bits data that is to be stored in a selected memory cell 306. In some implementations, the $2^N$ pieces of N-bits data may be represented by (in the form of) a gray code. A gray code (a.k.a., reflected binary code (RBC) or reflected binary (RB)) is an ordering of the binary numeral system such that two successive values differ in only one bit (binary digit). For example, TABLE 1 below shows an example of a binary code representing a one-to-one mapping between 8 levels (LV 0 to LV 7) and 8 pieces of 3-bits data used in the example of FIG. 6. As shown in TABLE 1, each piece of 3-bits data may consist of three bits of binary values (b1, b2, and b3). In one example, level 1 may correspond to a piece of 3-bits data having a value of 000. In another example, level 7 may correspond to another piece of 3-bits data having a value of 101.

TABLE 1

| LV | 0 | 1 | 2 | 3 | 4 | 5 | 6 | 7 |
|----|---|---|---|---|---|---|---|---|
| b1 | 1 | 0 | 1 | 0 | 0 | 1 | 0 | 1 |
| b2 | 1 | 0 | 0 | 1 | 0 | 1 | 1 | 0 |
| b3 | 1 | 0 | 0 | 0 | 1 | 0 | 1 | 1 |

Also referring to FIG. 5, in a program operation, user data can be used to program a selected row of memory cells 306 coupled to select word line 318. In some implementations, user data is transmitted through data bus 518 to page buffer/sense amplifier 504, and page buffer/sense amplifier 504 is configured to convert the user data into data to be programmed into a respective row of memory cells 306 based on a preset gray code. Based on the preset gray code, which defines the mapping of each programmed level and a respective piece of N-bits data, control logic 512 is configured to send control signals (e.g., enable signals) to page buffer/sense amplifier 504 to allow page buffer/sense amplifier 504 to generate data for sequential program operations, according to some implementations. During the ongoing program operation, the current data can be temporarily stored in page buffer/sense amplifier 504, and page buffer/sense amplifier 504 can be configured to provide to each memory cell 306 coupled to select word line 318 the corresponding data through the corresponding bit line 316.

To perform a program operation, in addition to page buffer/sense amplifier 504 providing to each select memory cell 306 the corresponding data, row decoder/word line driver 508 can be configured to apply program voltages and verify voltages to a select word line 318 coupled to a select row of memory cells 306 in one or more program/verify loops in order to raise the threshold voltage of each select memory cell 306 to a desired level (into a desired range of threshold voltages) based on the corresponding data.

Figure 7A:
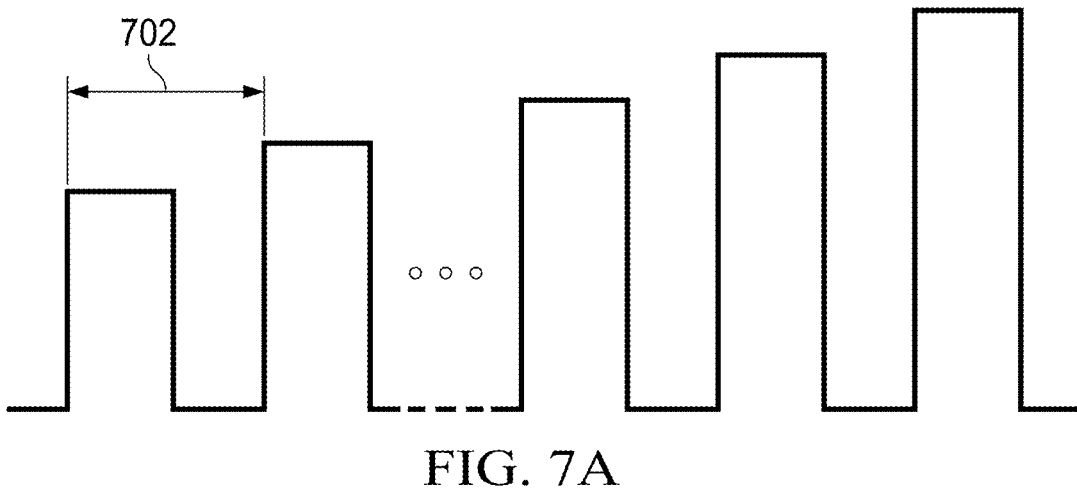
FIGS. 7A and 7B illustrate a waveform of word line voltages applied to a selected word line in an example program operation, in accordance with one or more implementations of the present disclosure.
Figure 7B:
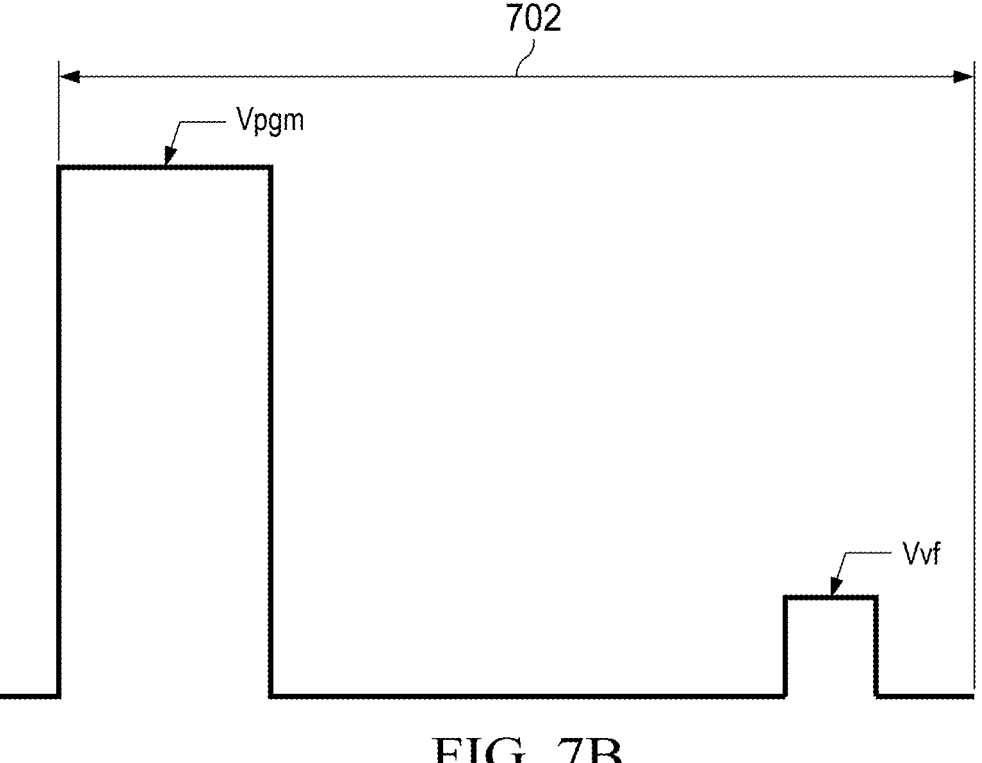

FIGS. 7A and 7B illustrate a waveform of word line voltages applied to a word line in a program operation, according to some implementations of the present disclosure. As shown in FIG. 7A, the program operation includes one or more program/verify loops (cycles) 702. As shown in FIG. 7B, in each program/verify loop 702, row decoder/word line driver 508 can be configured to apply a program voltage ($V_{pgm}$) on a target word line (e.g., word line 318) and apply one or more verify voltages ($V_{vf}$) to verify whether a target memory cell has been properly programmed. In some examples, when a memory cell is programmed using an incremental pulse scheme, such as an ISPP scheme, the program voltage applied to the target word line is increased through a sequence of steps until programming is completed. After each incremental pulse, a verify voltage can be applied to the target word line to check the memory cell's threshold voltage. If the memory cell's threshold voltage is still lower than an expected voltage level corresponding to a target programmed state, the program/verify loop continues until the memory cell's threshold voltage is equal to or higher than the expected voltage level.

In some implementations, verification of different programmed states of a memory cell can start at different pulses or program/verify loops. For example, verification of a memory cell programmed to a lowest programmed state can start from the first program pulse. Verification of a memory cell programmed to a higher programmed state can start after a few program pulses. For example, there are 7 programmed states from 'P1' to 'P7' of a TLC memory cell. Each one of 7 programmed states from 'P1' to 'P7' corresponds to a respective threshold voltage range of the memory cell. In such examples, the programmed state 'P1' can correspond to the lowest threshold voltage ranges among the 7 programmed states, and the programmed state 'P2' can correspond to the second lowest threshold voltage ranges, and so on. Verification of the programmed state 'P1' can start from the first pulse or program/verify loop. Verification of the programmed state 'P2' can start from the seventh pulse or program/verify loop.

FIG. 8 illustrates an example process 800 of managing program operations in a memory device, according to some implementations of the present disclosure. Process 800 can be performed by any suitable device as described herein, such as memory device 104, memory device 106, or memory device 300. The operations shown in process 800 may not be exhaustive and that other operations can be performed as well before, after, or in between any of the illustrated operations. Further, some of the operations may be performed simultaneously, or in a different order than shown in FIG. 8.

In process 800, a peripheral circuit (e.g., peripheral circuit 302) obtains a first temperature (802). In some implementations, the peripheral circuit is coupled to a memory cell array (e.g., memory cell array 301) in a memory device (e.g., memory device 300).

In memory devices, the voltage required to program memory cells can be influenced by temperature. In some implementations, the first temperature is an environmental temperature surrounding the device. In some implementations, the first temperature is a device temperature.

In implementations where the peripheral circuit obtains the environmental temperature surrounding the memory device, the environmental temperature is the ambient temperature in the device's operating environment. The environmental temperature pertains to the ambient conditions surrounding the memory device and can fluctuate based on external factors. These variations in environmental temperature can alter the threshold voltage levels of memory cells, thus impacting the program voltage.

In some implementations, the environmental temperature is obtained by using one or more of a sensor (e.g., an external sensor or a sensing mechanism integrated with the memory device), remote sensing, or integrated system monitoring. In some examples, external sensors can be placed in the environment where the memory device operates. The external sensors can be thermistors, thermocouples, or semiconductor temperature sensors, such as those known for their precision and reliability. In some examples, remote sensing technologies, e.g., infrared sensors or thermal cameras, are used to obtain the environmental temperature, especially, e.g., in large data centers or controlled environments. In some examples, the environmental temperature can be obtained through integrated system monitoring tools that include environmental sensors for temperature, e.g., for systems like servers.

In implementations where the peripheral circuit obtains the device temperature, the device temperature can be the internal temperature of the device itself. In some instances, the internal temperature of the device is primarily influenced by operational heat generation. During prolonged or intensive read-write cycles, the device's temperature can rise, leading to changes in the physical properties of memory cells. This increase in internal temperature can necessitate adjustments in the program voltage to maintain optimal performance and reliability.

In some implementations, the device temperature is obtained by using on-chip temperature sensors, external attachable sensors, software monitoring tools, or thermal imaging, or other temperature sensing, detecting, or monitoring techniques. In some examples, the memory device can use its built-in temperature sensors to provide real-time data about the internal temperature of the device. In some examples, external sensors (like surface-mounted thermistors) can be attached to the device casing to measure its surface temperature, which can be an approximation of the internal temperature. In some examples, software solutions can read out the temperature data from the device's built-in sensors, e.g., in computer systems where the BIOS or operating system has utilities to monitor the temperature of various components including memory devices. In some examples, thermal imaging cameras can be used to visualize the heat generated by the device, providing a detailed thermal profile that can be useful for understanding temperature distribution across the device.

In some implementations, one or both environmental and device temperatures are factors in determining the appropriate program voltage for memory cells in non-volatile memory devices. The precise management of these temperatures can ensure the efficiency, accuracy, and longevity of the memory device. The accuracy, response time, and integration capability of the chosen temperature measurement method can be taken into consideration when incorporating these temperature measurement methods into a memory device's design or operational protocol. In some implementations, a combination of these methods may be employed for comprehensive temperature monitoring.

In semiconductor devices, including CMOS (Complementary Metal-Oxide-Semiconductor) technologies, there can be a relationship between program voltage and temperature due to the physical properties of the materials and the electronic behavior within the device. For example, at lower temperatures, the mobility of charge carriers (electrons and holes) decreases because the carriers gain less thermal energy, making it harder for them to move through the semiconductor lattice. To overcome this and inject the necessary charge into a floating gate or change the state of a memory cell, a higher voltage may be required. The threshold voltage of a transistor (the minimum voltage needed to create a conducting path between the source and drain) is also temperature-dependent. At lower temperatures, the threshold voltage increases. Therefore, to turn on a transistor in a memory cell at a lower temperature, a higher voltage is often required. In some examples, a maximum program voltage of memory cells in −25 Celsius degrees can be higher than the maximum program voltage of the memory cells in 85 Celsius degrees.

In some cases, a miniaturized memory device, such as one built using compact CMOS technology, cannot provide high enough program voltage at low temperatures due to limitations in the string driver's driving capability. In such cases, an adaptive voltage pulse width scaling method can be used to address the issue. For example, the program voltage width (e.g., a time duration during which a program pulse with a program voltage is applied) can be negatively correlated with the temperature, such that a lower temperature corresponds to a larger voltage pulse width. For example, when the temperature is below the threshold, a program pulse with a certain program voltage is applied for a longer period of time than the program pulse with the certain program voltage is applied when the temperature is at or above the threshold.

In response to determining that the first temperature is at or above a predetermined threshold, the peripheral circuit applies a first program voltage pulse with a first pulse width to a specified word line coupling memory cells of the memory cell array (804).

In some implementations, the threshold is used for adaptive voltage pulse width scaling, such that a program voltage pulse when the temperature is at or above the threshold is smaller than a program voltage pulse when the temperature is below the threshold.

In some implementations, determining the threshold for voltage pulse scaling in a memory device, particularly for the purpose of adapting to different temperatures, involves one or more of theoretical analysis, empirical testing, and consideration of device-specific characteristics. In some examples, determining the threshold can involve using electronic device modeling tools to simulate how the memory device behaves under various temperatures and voltages. This can provide a theoretical basis for what voltage levels might be optimal at different temperatures. In some examples, determining the threshold can involve conducting controlled experiments by varying the temperature of the memory device, observing its performance at different program voltages, and measuring parameters such as a programming speed, an error rate, power consumption, and/or reliability. In some examples, determining the threshold can involve considering the specific limitations and capabilities of the memory device, such as the maximum and minimum programmable voltages, the precision of the temperature sensing mechanism, and the range of operating temperatures. In some examples, safety margins can be also included in the threshold determination. This means setting the threshold slightly inside the range where the device operates reliably at both higher and lower voltages. Long-term reliability testing can be also performed to ensure that the chosen threshold does not lead to increased wear or failure rates over the device's expected lifespan.

As an example, the predetermined threshold is zero degree Celsius. In some examples, the predetermined threshold can be any suitable temperature determined based on one or more of theoretical analysis, empirical testing, or consideration of device-specific characteristics.

In some cases, the adaptive voltage pulse width scaling can be performed on a specified word line. The specified word line can be identified or otherwise specified in a command, such as a command sent from the peripheral circuit coupled to the memory cell array to the memory cell array. In some implementations, the specified word line is selected based on a size of channel structures associated with the specified word line. In some cases, memory cells associated with a larger channel structure size (critical dimension) can have a higher program voltage than memory cells associated with a smaller channel structure size. For example, a maximum program voltage applied to a word line coupling memory cells in top layers of an upper or lower deck of a memory cell array can be relatively higher than a maximum program voltage applied to a word line coupling memory cells in the bottom layers of a same upper or lower deck. In such cases, a word line coupling the memory cells having larger channel structure sizes than those coupling the other memory cells can be selected to perform adaptive voltage pulse width scaling. For example, referring to FIG. 4, word lines coupling memory cells in the one or more topmost layers in each deck of upper deck 430 and lower deck 440 can be selected to perform adaptive voltage pulse width scaling.

In some implementations, the specified word line is selected based on threshold voltages of the memory cells. In some implementations, the specified word line is coupling memory cells having threshold voltages exceeding a predetermined threshold. In some implementations, the threshold voltages of the memory cells can be determined based on experimental measurements and/or computational modeling. In some examples, the determination of the threshold voltages of the memory cells can include conducting voltage sweep tests on a representative set of memory cell samples, followed by a detailed analysis of the voltage-current responses to identify the threshold voltage for each cell. This data can be complemented by robust statistical analysis and validated through advanced computational modeling, accounting for environmental and operational variables.

In some implementations, to apply the first program voltage pulse with the first pulse width to program memory cells, the memory device can raise the voltage of the word line, with strict timing control ensuring adherence to the predetermined pulse width. Continuous monitoring of the programming process, including post-program verification through error correction codes, allows for real-time adjustments based on feedback and environmental factors like temperature. This process can ensure accurate programming of the memory cells, promoting the device's performance and longevity, with documentation and compliance to specifications being key for operational consistency.

In some implementations, Incremental Step Pulse Programming (ISPP) is used to program the memory cells. Instead of programming a memory cell in a single, large pulse, ISPP uses multiple smaller voltage pulses. Each pulse incrementally increases the charge in the memory cell. After each incremental pulse, the cell's threshold voltage can be checked. This verification ensures that the cell is not overcharged, which could lead to damage or data corruption. The process adapts based on the cell's response to each pulse. If the cell is close to reaching its target threshold voltage, the subsequent pulses are reduced in magnitude or stopped altogether.

By programming the cells incrementally, ISPP allows for more precise control of the cell's threshold voltage, reducing the likelihood of over-programming or under-programming. This finer control also means less stress on the memory cells, which can significantly improve their reliability and longevity. Memory cells have a limited number of write-erase cycles. ISPP can help extend the lifespan of these cells by minimizing wear during programming. Incremental programming can be more energy-efficient compared to programming a cell with a single large pulse. ISPP is particularly beneficial in xLC such as multi-level cell (MLC) and triple-level cell (TLC) technologies, where the precision of programming is crucial due to the multiple bits stored in each cell.

In some implementations, when ISPP is used to program the memory cells, the first program voltage pulse in step 804 is a maximal program voltage pulse among multiple program voltage pulses (e.g., the last program voltage pulse) in an ISPP cycle applied to the specified word line. The maximal program voltage pulse has a maximal voltage among the multiple program voltage pulses in the ISPP cycle.

In some cases, when the temperature, e.g., the first temperature as obtained in step 802, is above or at the predetermined threshold, the programming mechanism as described herein can switch to a static mode of operation. In this static mode, a consistent program voltage pulse is employed, with a fixed pulse width that remains invariant despite further changes in temperature as long as the temperature is above or at the predefined threshold. This can ensure stable and uniform programming of the memory cells under higher temperature conditions.

Conversely, when the temperature is below this specified threshold, the memory device can engage an adaptive mode. In this mode, the pulse width of the program voltage is dynamically adjusted in response to changes in temperature, with a longer pulse width applied as the temperature decreases.

The peripheral circuit obtains a second temperature (806). In some implementations, the second temperature is the environmental temperature surrounding the device. In some implementations, the second temperature is the device temperature.

In some examples, when the first temperature is the environmental temperature, the second temperature can also be the environmental temperature. In some examples, when the first temperature is the device temperature, the second temperature can also be the device temperature.

In response to determining that the second temperature is below the predetermined threshold, the peripheral circuit applies a second program voltage pulse with a second pulse width to the specified word line, wherein the second pulse width is larger than the first pulse width (808).

In some implementations, when ISPP is used to program the memory cells, the second program voltage pulse in step 808 is a maximal program voltage pulse among multiple program voltage pulses (e.g., the last program voltage pulse) in an ISPP cycle applied to the specified word line. The maximal program voltage pulse has a maximal voltage among the multiple program voltage pulses in the ISPP cycle.

In some implementations, the second pulse width is determined based on the second temperature. In such implementations, the second pulse width is negatively correlated with the second temperature, such that a decrease in the second temperature corresponds to an increase in the second pulse width. In some examples, a changing rate of the pulse width with respect to the temperature, e.g., the relationship between the difference in the pulse widths of two voltage pulses and the difference in two temperatures can be defined through a predetermined function, which can be linear, non-linear, or follow a more complex model. In some examples, a constant changing rate of the pulse width with respect to the temp increase can be used such as from −20 ns/C or −40 ns/C, to help reduce the maximum program voltage. In some examples, another fixed or variable step size can be used to determine the second pulse width based on the second temperature as well as the relationship between the pulse width and the temperature.

In some cases, at lower temperatures, the semiconductor properties of the memory cells necessitate a higher program voltage for effective data storage. However, due to the limited capacitive driving ability of the string driver in a miniaturized device context, achieving the requisite higher program voltage becomes challenging. This limitation can be due to the reduced physical dimensions of the components, which inherently constrain the voltage levels that can be effectively applied.

To address this challenge, the memory device can be equipped with a control mechanism that adaptively increases the pulse width of the program voltage under low-temperature conditions. By extending the duration of the program pulse, the memory cells can receive sufficient energy for reliable programming, even at lower voltage levels. This method can compensate for the reduced voltage capacity stemming from the limited capacitive driving ability of the string driver in a miniaturized format.

Increasing the pulse width of the program voltage pulse as the temperature drops in memory devices can be accomplished through a temperature-aware control mechanism. In some examples, temperature sensors can be incorporated into the memory device to provide real-time temperature data. The memory device can be programmed with algorithms that adjust the pulse width based on the temperature data received. In some implementations, this can be implemented by using a mapping between specific temperatures and corresponding desired pulse widths. Adaptive control algorithms can be developed to dynamically adjust the pulse width of the program voltage in response to temperature changes. These algorithms can be designed to increase the pulse width as the temperature decreases. In some examples, lookup tables or models (e.g., a statistical model or a machine learning model) can be utilized within the memory device to define the relationship between temperature and pulse width. In some implementations, as the temperature sensor detects lower temperatures, the memory device uses these tables or models to determine the appropriate pulse width or increase in pulse width. In some examples, the memory device can be designed to allow for firmware updates, enabling adjustments to the temperature-pulse width relationship as needed based on updated performance data or technological advancements.

This dual-mode programming approach, adaptive at lower temperatures and static at higher temperatures, is designed to optimize the reliability and efficiency of the memory programming process across a diverse range of environmental conditions. The specific temperature threshold for determining the lower temperatures and higher temperatures, along with the parameters for pulse width adjustment, can be calibrated based on empirical testing to achieve or approach optimal performance and longevity of the memory device.

In some implementations, the second pulse width is determined based on a critical dimension (e.g., a size of channel structures) associated with the specified word line. In some examples, the second pulse width is positively correlated with the size of channel structures associated with the specified word line, such that an increase in the size of channel structures associated with the specified word line corresponds to an increase in the second pulse width. In some cases, memory cells with larger channel structure sizes necessitate a correspondingly larger pulse width of the program voltage. This requirement stems from the intrinsic electrical properties of the memory cells, where a larger channel structure size correlates to a greater charge capacity that needs to be filled for effective programming. Consequently, to ensure complete and reliable programming of these cells, a longer duration of voltage application—or a larger pulse width—can be applied to word lines coupling these cells. Such a method can be advantageous in memory devices with heterogeneous memory cell architectures, where variations in channel structure size can impact programming efficiency and device performance. In some examples, the relationship between the difference in the pulse widths and the difference in the channel sizes can be defined through a predetermined function, which can be linear or non-linear, or follow a more complex model. In some examples, a program pulse width can be increased proportionally to an increase in the critical dimension associated with the specified word line. For example, a program pulse width applied to a word line associated with a larger critical dimension can be determined by adding a program pulse width applied to a word line associated with a smaller critical dimension with a weighted difference between the larger critical dimension and the smaller critical dimension. By tailoring the program voltage pulse width to the specific requirements of each memory cell based on its critical dimension, this method can improve the reliability, efficiency, and overall performance of memory devices.

In some implementations, a consistent program voltage pulse is applied to one or more word lines other than the specified word line, with a fixed pulse width that remains invariant despite further changes in temperature. In some examples, the pulse width applied to the one or more word lines other than the specified word line can be the same as the first pulse width. In some examples, the pulse width applied to the one or more word lines other than the specified word line can be the different from the first pulse width.

In some cases, while the augmentation of pulse width in the program voltage of memory cells is a viable strategy to counteract the challenges posed at low temperatures, it may introduce the potential risk of over-programming. Over-programming, a condition where an excess of charge is injected into the memory cells, can lead to the deterioration of data integrity, primarily through the loss of electronic charge summation accuracy. For example, when the program pulse width—the duration for which the program voltage is applied to a cell—is too long, more charge can be injected into the floating gate of a memory cell than what is necessary. This may raise the threshold voltage of the cell too much, leading to a state where the cell cannot be easily read or may be read incorrectly. Such over-programming can change the state of the cell beyond the intended programmed states, potentially leading to data corruption. Furthermore, if a memory cell is applied with a program voltage with a long pulse width, the memory cell is exposed to the program voltage for an extended period, which may increase power consumption and generate more heat, affecting the device's performance and reliability. Moreover, an extended program pulse width may cause too much charge to accumulate on the floating gate. The excess charge may lead to increased threshold voltage, charge leakage, or breakdown of the oxide layer. For example, the additional charge may increase the threshold voltage of the transistor to a level that is higher than intended, making it difficult to read the data correctly. Over time, if the floating gate is overcharged, it may begin to leak this excess charge more quickly than it normally would. This could lead to data retention issues, where the stored data may be lost or corrupted over a shorter period than the expected lifetime of the device. Over-programming may stress the oxide layer in the memory cell due to prolonged exposure to high electric fields, which can degrade the cell's reliability over time and reduce the number of effective write-erase cycles.

In some implementations, to address the potential issues related to over-programming, the memory device can be configured to reduce an initial program voltage at lower temperatures. In some cases, instead of applying a full program voltage immediately, the memory device can use a gradual ramp-up approach, which begins with a low initial voltage and incrementally increase it only if necessary. This helps to prevent the application of excessive charge to the cells. In some examples, the initial program voltages can be calibrated by empirically determining the lowest effective program voltage for the memory cells. This can include testing various voltage levels to find a minimum or a suitable voltage that reliably programs the cells without causing over-programming.

In some implementations, applying the first program voltage pulse with the first pulse width to the specified word line includes applying a first initial program voltage to the specified word line, and applying the second program voltage pulse with the second pulse width to the specified word line includes applying a second initial program voltage to the specified word line, where the second initial program voltage is lower than the first initial program voltage.

Reducing the initial program voltage in memory devices can achieve several technical advantage and benefits, including prolonged cell longevity due to reduced stress on memory cells, lower power consumption, enhanced energy efficiency, improved data integrity by minimizing program disturb effects, and overall improved device reliability. This approach can also aid in effective thermal management by generating less heat, facilitates scalability in advanced miniaturized semiconductor technologies, and simplify integration with other low-voltage electronic components. By mitigating the stress on memory cells and reducing the risk of over-programming, the overall reliability of the memory device is improved. This can result in fewer errors and a more stable storage medium over the device's lifespan.

In some implementations, to address the potential issues related to over-programming, the memory device can be configured to advance program verification in the program/verify loops when programming memory cells to one or more particular programmed states at lower temperatures. In some examples, the memory device can be configured to apply program voltages and verify voltages to a selected word line coupled to selected memory cells in one or more program/verify loops in order to raise the threshold voltage of each memory cell to a desired level (into a desired range of a target threshold voltage).

In some implementations, programming a memory cell coupled to the specified word line, as described in each of steps 804 and 808, includes sequentially performing a plurality of program/verify loops. In such implementations, when the first temperature is at or above the predetermined threshold, the peripheral circuit is configured to start verification of the particular memory cell in a first program/verify loop. When the second temperature is below the predetermined threshold, the peripheral circuit is configured to start verification of the particular memory cell in a second program/verify loop, where the second program/verify loop has an ordinal number that is less than an ordinal number of the first program/verify loop, for example, by one or another number of program/verify loop.

FIG. 9 illustrates example program/verify loops when programing a three bits per cell (TLC) memory cell to different programmed states, in accordance with one or more implementations of the present disclosure. As shown in FIG. 9, there are 7 programmed states from 'P1' to 'P7' of the TLC memory cell. Each one of 7 programmed states from 'P1' to 'P7' corresponds to a respective threshold voltage range of the memory cell. In some examples, the programmed state 'P1' corresponds to the lowest threshold voltage ranges among the 7 programmed states, and the programmed state 'P7' corresponds to the highest threshold voltage ranges among the 7 programmed states.

In the shown example, a series of pulses (e.g., from 1 to 23) can be applied to a TLC memory cell to program the TLC memory cell to a target programmed state. Each pulse can represent a program/verify loop that includes at least one program pulse and at least one verify pulse. In some implementations, verification of different programmed states can start at different pulses or program/verify loops. Different pulses or program/verify loops can involve verification of different programmed states. For example, verification of the programmed state 'P1' can start from the first program/verify loop and end at the eighth program/verify loop. Verification of the programmed state 'P2' can start from the seventh program/verify loop and end at the eleventh program/verify loop.

In some cases, to address the potential issues related to over-programming, the memory device can be configured to advance program verification (i.e., perform program verification earlier) when programming a memory cell to a target programmed state at lower temperatures than when programming the memory cell to the target programmed state at higher temperatures. For example, when programming a particular memory cell to the programmed state 'P2', the memory device can be configured to start verification in the seventh program/verify loop, when the temperature is above or at the predetermined threshold, e.g., 0 degrees Celsius. When temperature is below the predetermined threshold, the memory device can be configured to start verification in the sixth program/verify loop when programming the particular memory cell to the programmed state 'P2'.

In some implementations, when the programmed state 'P1' corresponds to the lowest threshold voltage ranges among the 7 programmed states, the memory device can be configured to always start verification in the first program/verify loop despite further changes in temperature when programming a memory cell to the programmed state 'P1'.

Advancing the verification process in programming memory cells can help prompt detection of over-programming. This early intervention can prevent the excessive accumulation of charge in the memory cells that may degrade performance and longevity of the memory cells. Advancing the verification process can help ensure that the data has been correctly written to the memory cells and help maintain high data integrity, as any errors can be identified and corrected sooner. By reducing the occurrences of over-programming, the wear and tear on the memory cells are minimized, thereby extending operational lifespan of the memory cells.

Figure 10:
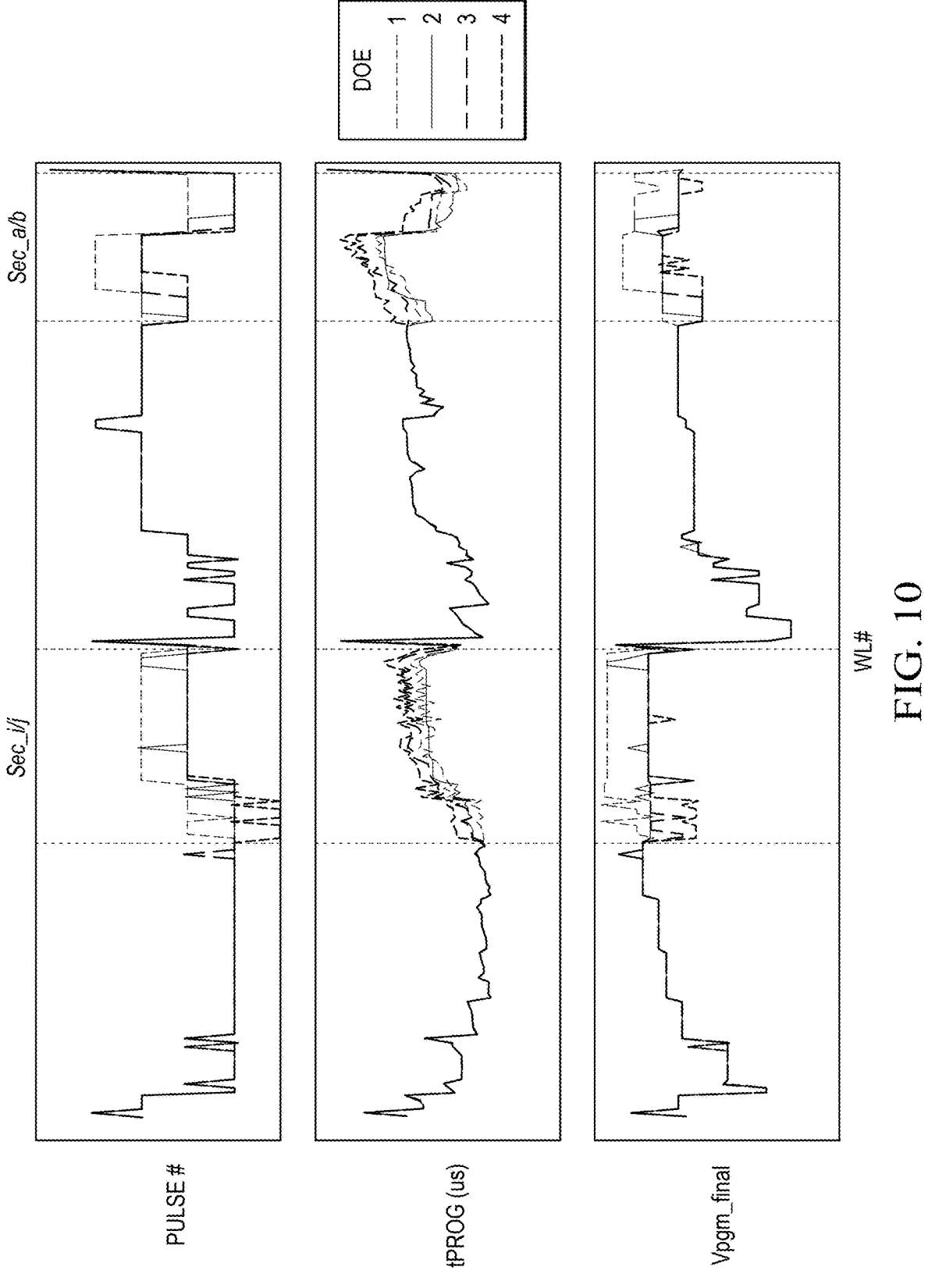
FIG. 10 illustrates a diagram showing example effects of increasing program pulse width on maximum final program voltage, in accordance with one or more implementations of the present disclosure.
Figure 11:
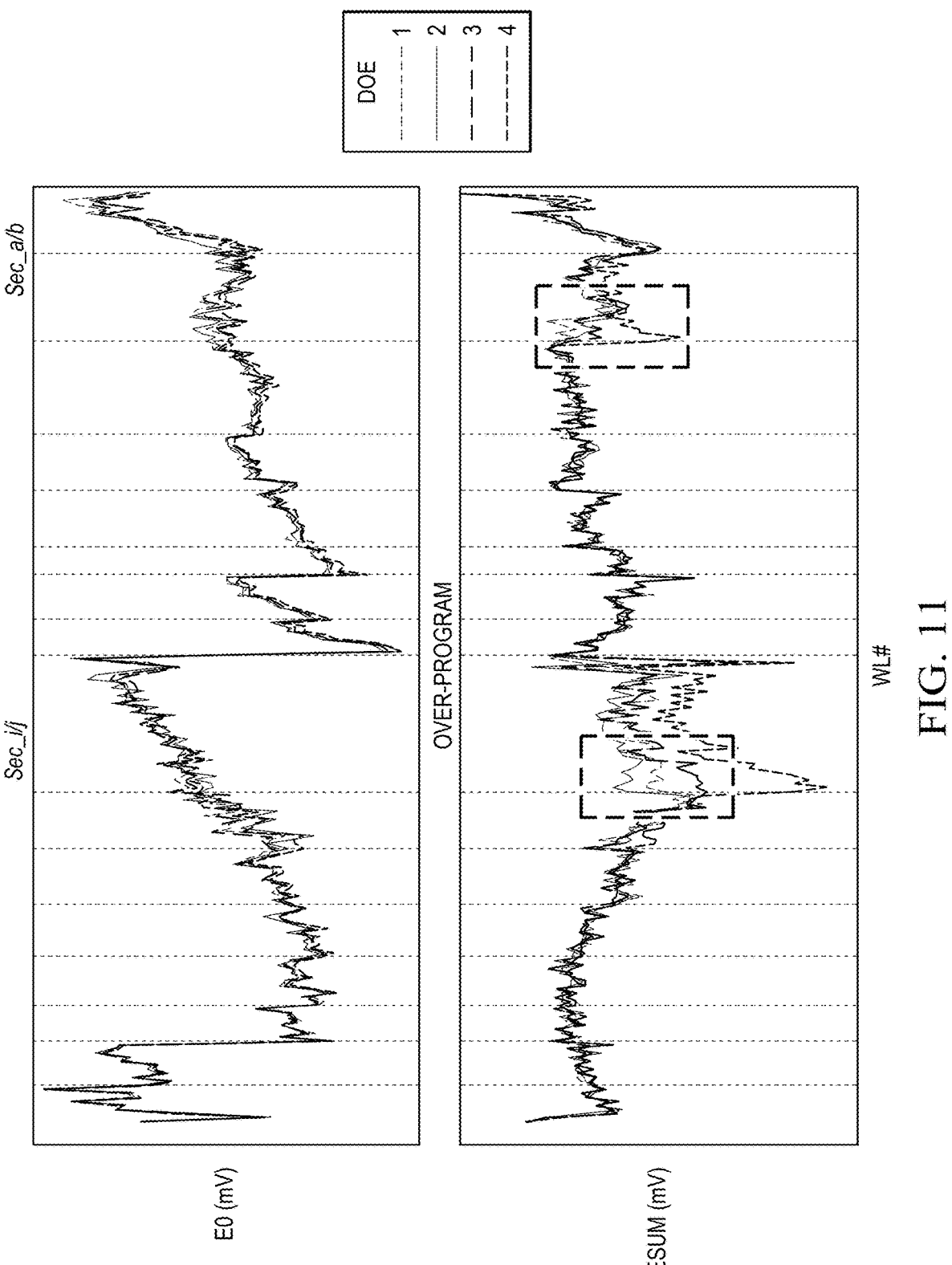
FIG. 11 illustrates a diagram showing example effects of increasing program pulse width on E-sum loss, in accordance with one or more implementations of the present disclosure.
Figure 12:
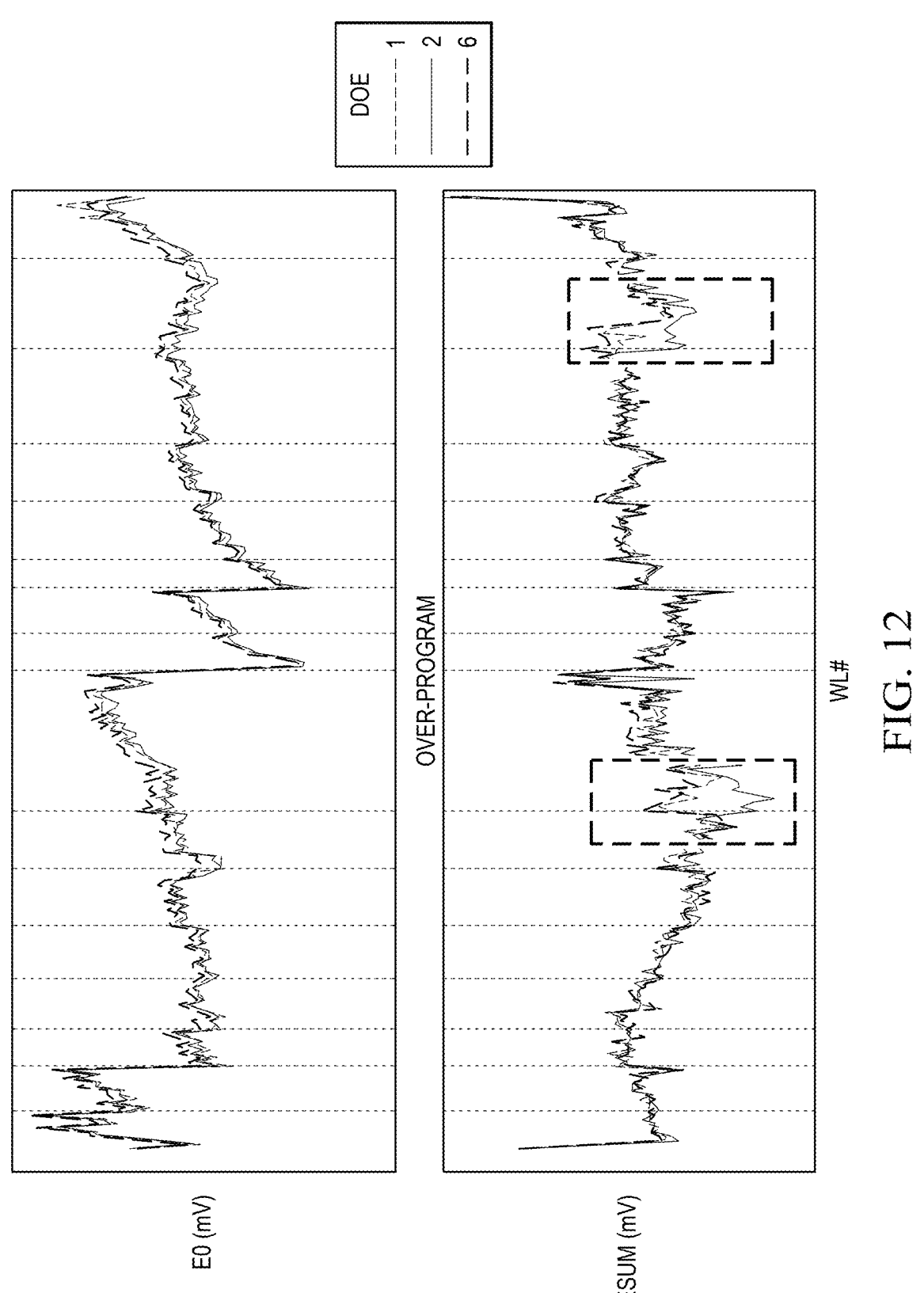
FIG. 12 illustrates a diagram showing example effects of advancing verification in the program/verify loops while increasing program pulse width on E-sum loss, in accordance with one or more implementations of the present disclosure.
Figure 13:
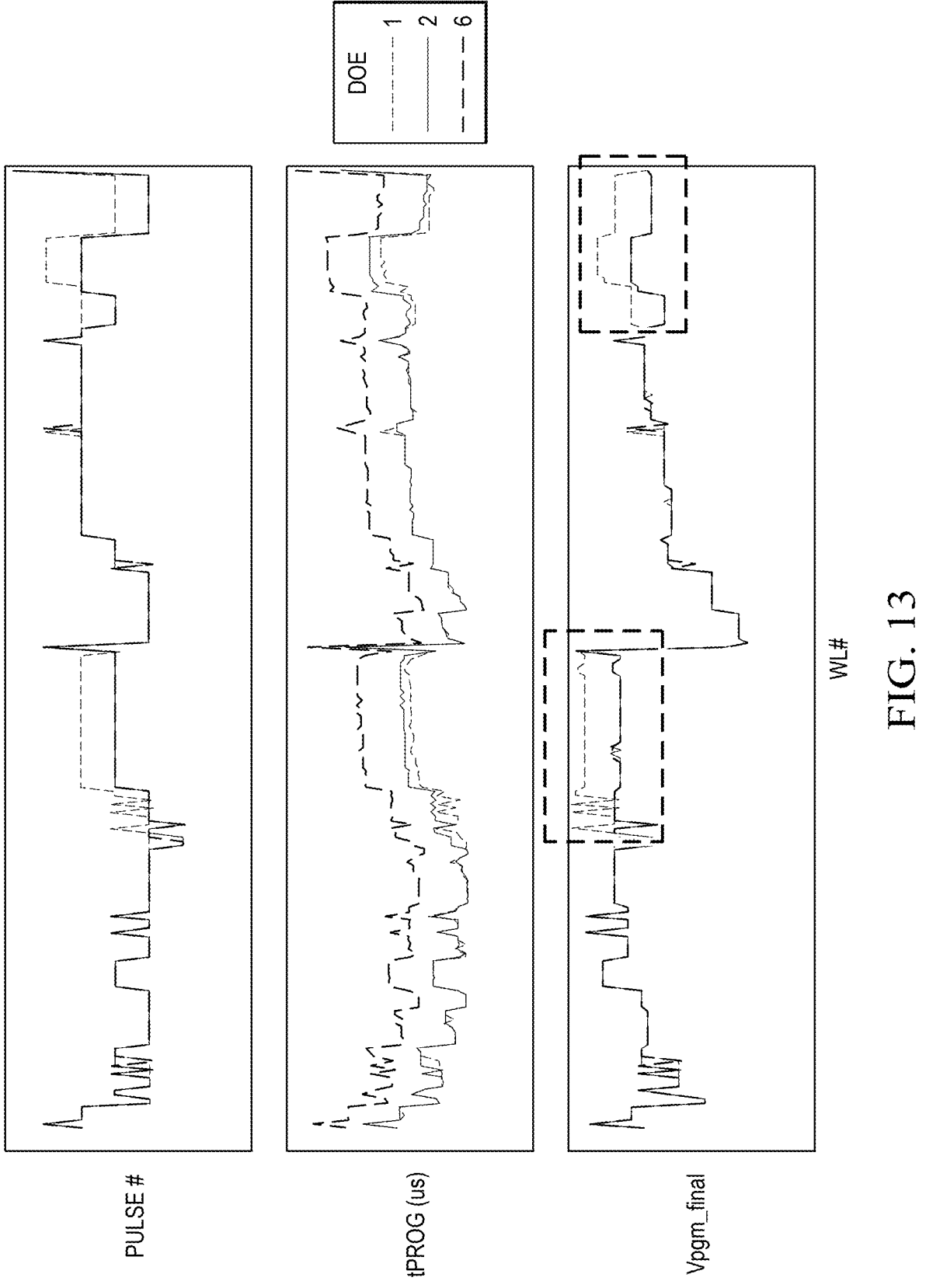
FIG. 13 illustrates a diagram showing example effects of advancing verification in the program/verify loops while increasing program pulse width on maximum final program voltage, in accordance with one or more implementations of the present disclosure.
Figure 14:
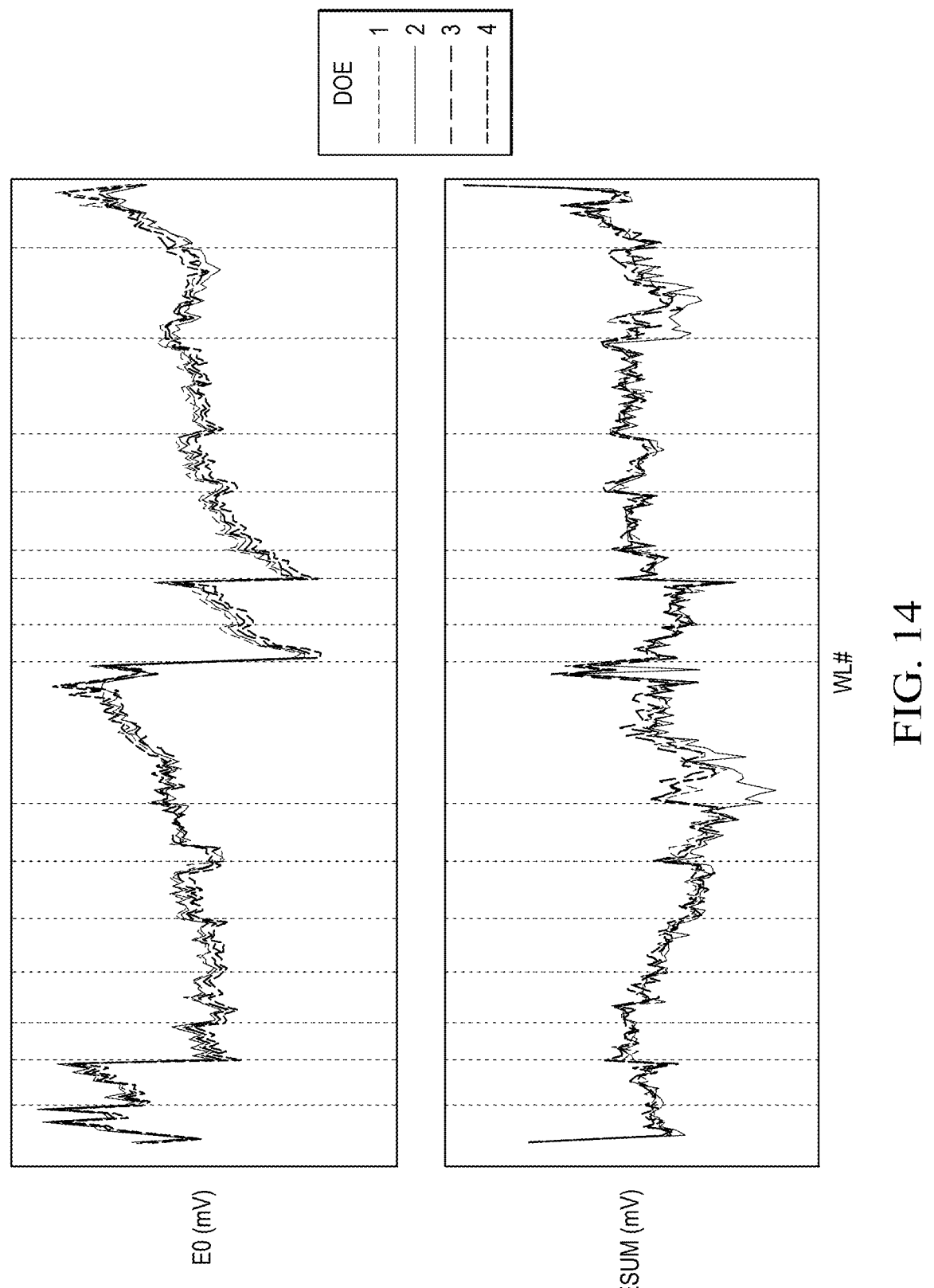
FIG. 14 illustrates a diagram showing example effects of reducing initial program voltage on E-sum loss, in accordance with one or more implementations of the present disclosure.
Figure 15:
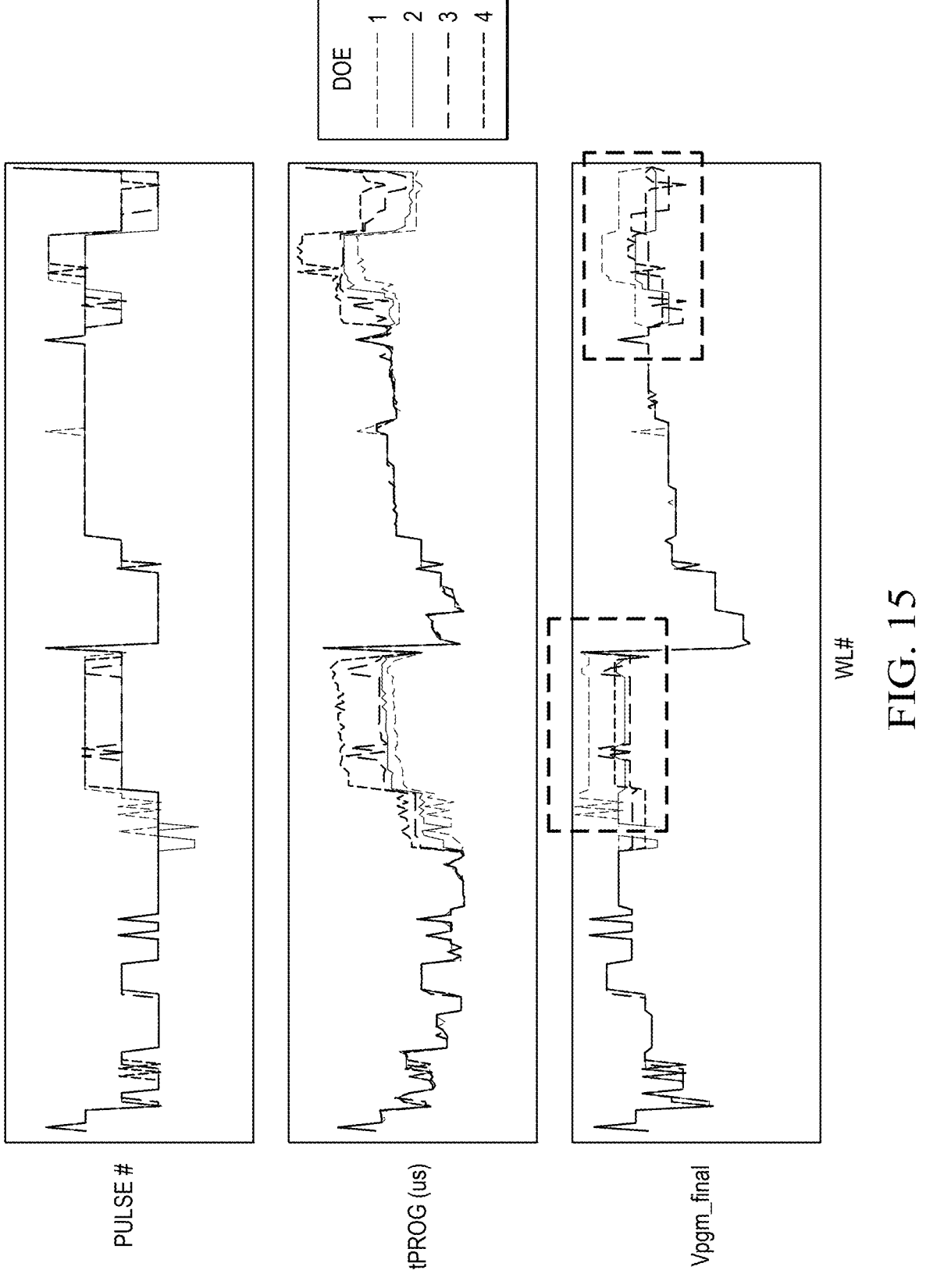
FIG. 15 illustrates a diagram showing example effects of reducing initial program voltage while increasing program pulse width on maximum final program voltage, in accordance with one or more implementations of the present disclosure.

FIGS. 10-15 show example performances of a memory device when programming memory cells in the memory device using the described program operation managing techniques, in accordance with one or more implementations of the disclosed techniques. FIG. 10 shows that increasing program pulse width (represented by $t_{PROG}$) by a few us causes the maximum final program voltage to decrease by approximately 0.5 volts. FIG. 11 shows that increasing the program pulse width causes E-sum loss (electronic charge summation loss), potentially due to over-programming. FIG. 12 shows that advancing verification in the program/verify loops, while increasing the program pulse width, can help compensate the E-sum loss caused by over-programming. FIG. 13 shows that advancing verification in the program/verify loops, while increasing program pulse width, can still achieve the benefits of reducing the maximum final program voltage. FIG. 14 shows that reducing initial program voltage can help compensate the E-sum loss caused by over-programming. FIG. 15 shows that reducing initial program voltage, while increasing program pulse width, can still achieve the benefits of reducing the maximum final program voltage.

Although specific configurations and arrangements have been discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described example implementations, but should be defined only in accordance with the following claims and their equivalents. Accordingly, other implementations also are within the scope of the claims.

What is claimed is:

1. A memory device, comprising:
a memory cell array; and
a peripheral circuit coupled to the memory cell array, wherein the peripheral circuit is configured to:
obtain a first temperature;
in response to determining that the first temperature is at or above a predetermined threshold, apply a first program voltage pulse with a first pulse width to a specified word line coupling memory cells of the memory cell array;
obtain a second temperature; and
in response to determining that the second temperature is below the predetermined threshold, apply a second program voltage pulse with a second pulse width to the specified word line, wherein the second pulse width is larger than the first pulse width.

2. The memory device according to claim 1, wherein the specified word line is selected based on a size of channel structures associated with the specified word line.

3. The memory device according to claim 1, wherein the second pulse width is determined based on the second temperature.

4. The memory device according to claim 3, wherein the second pulse width is negatively correlated with the second temperature, such that a decrease in the second temperature corresponds to an increase in the second pulse width.

5. The memory device according to claim 1, wherein the second pulse width is determined based on a size of channel structures associated with the specified word line.

6. The memory device according to claim 5, wherein the second pulse width is positively correlated with the size of channel structures associated with the specified word line, and wherein an increase in the size of channel structures associated with the specified word line corresponds to an increase in the second pulse width.

7. The memory device according to claim 1, wherein:
applying the first program voltage pulse with the first pulse width to the specified word line comprises applying a first initial program voltage to the specified word line; and
applying the second program voltage pulse with the second pulse width to the specified word line comprises applying a second initial program voltage to the specified word line,
wherein the second initial program voltage is lower than the first initial program voltage.

8. The memory device according to claim 1, wherein the peripheral circuit is configured to program a particular memory cell to a particular programmed state, and wherein programming the particular memory cell to the particular programmed state comprises sequentially performing a plurality of program/verify loops, and wherein:
when the first temperature is at or above the predetermined threshold, the peripheral circuit is configured to start verification of the particular memory cell in a first pre-determined program/verify loop; and
when the second temperature is below the predetermined threshold, the peripheral circuit is configured to start verification of the particular memory cell in a second pre-determined program/verify loop,
wherein the second pre-determined program/verify loop has an ordinal number that is less than an ordinal number of the first pre-determined program/verify loop by one.

9. The memory device according to claim 8, wherein the particular programmed state is one of a plurality of programmed states, each of the plurality of programmed states corresponds to a respective threshold voltage range of the particular memory cell, and the particular programmed state corresponds to a second lowest threshold voltage ranges among the plurality of programmed states.

10. The memory device according to claim 1, wherein the second program voltage pulse is a maximal program voltage pulse among multiple program voltage pulses in an incremental step pulse programming (ISPP) cycle applied to the specified word line; and the maximal program voltage pulse has a maximal voltage among the multiple program voltage pulses in the ISPP cycle.

11. A method, comprising:
obtaining, by a peripheral circuit coupled to a memory cell array, a first temperature;
in response to determining that the first temperature is at or above a predetermined threshold, applying, by the peripheral circuit, a first program voltage pulse with a first pulse width to a specified word line coupling memory cells of the memory cell array;
obtaining, by the peripheral circuit, a second temperature; and
in response to determining that the second temperature is below the predetermined threshold, applying, by the peripheral circuit, a second program voltage pulse with a second pulse width to the specified word line, wherein the second pulse width is larger than the first pulse width.

12. The method according to claim 11, wherein the specified word line is selected based on a size of channel structures associated with the specified word line.

13. The method according to claim 11, comprising:
determining, by the peripheral circuit, the second pulse width based on the second temperature.

14. The method according to claim 13, wherein the second pulse width is negatively correlated with the second temperature, such that a decrease in the second temperature corresponds to an increase in the second pulse width.

15. The method according to claim 11, comprising:
determining, by the peripheral circuit, the second pulse width based on a size of channel structures associated with the specified word line.

16. The method according to claim 15, wherein the second pulse width is positively correlated with the size of channel structures associated with the specified word line, and wherein an increase in the size of channel structures associated with the specified word line corresponds to an increase in the second pulse width.

17. The method according to claim 11, wherein:
applying the first program voltage pulse with the first pulse width to the specified word line comprises applying a first initial program voltage to the specified word line; and
applying the second program voltage pulse with the second pulse width to the specified word line comprises applying a second initial program voltage to the specified word line,
wherein the second initial program voltage is lower than the first initial program voltage.

18. The method according to claim 11, comprising:
programming a particular memory cell to a particular programmed state, wherein programming the particular memory cell to the particular programmed state comprises sequentially performing a plurality of program/verify loops, and wherein:
when the first temperature is at or above the predetermined threshold, the peripheral circuit is configured to start verification of the particular memory cell in a first pre-determined program/verify loop; and
when the second temperature is below the predetermined threshold, the peripheral circuit is configured to start verification of the particular memory cell in a second pre-determined program/verify loop,
wherein the second pre-determined program/verify loop has an ordinal number that is less than an ordinal number of the first pre-determined program/verify loop by one.

19. The method according to claim 18, wherein the particular programmed state is one of a plurality of programmed states, each of the plurality of programmed states corresponds to a respective threshold voltage range of the particular memory cell, and the particular programmed state corresponds to a second lowest threshold voltage ranges among the plurality of programmed states.

20. A system, comprising a memory device and a controller coupled to the memory device, wherein the memory device comprises:
a memory cell array; and
a peripheral circuit coupled to the memory cell array, wherein the peripheral circuit is configured to:
obtain a first temperature;

in response to determining that the first temperature is at or above a predetermined threshold, apply a first program voltage pulse with a first pulse width to a specified word line coupling memory cells of the memory cell array;

obtain a second temperature; and in response to determining that the second temperature is below the predetermined threshold, apply a second program voltage pulse with a second pulse width to the specified word line, wherein the second pulse width is larger than the first pulse width.

<div align="center">* * * * *</div>